United States Patent
Lattard

(10) Patent No.: US 10,818,639 B2
(45) Date of Patent: Oct. 27, 2020

(54) 3D STACK OF ELECTRONIC CHIPS

(71) Applicant: COMMISSARIAT A L'ENERGIE ATOMIQUE ET AUX ENERGIES ALTERNATIVES, Paris (FR)

(72) Inventor: Didier Lattard, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/298,414

(22) Filed: Mar. 11, 2019

(65) Prior Publication Data
US 2019/0279965 A1 Sep. 12, 2019

(30) Foreign Application Priority Data

Mar. 12, 2018 (FR) ...................................... 18 52110

(51) Int. Cl.
*H01L 25/065* (2006.01)
*H01L 23/48* (2006.01)
(Continued)

(52) U.S. Cl.
CPC ........ *H01L 25/0657* (2013.01); *H01L 23/481* (2013.01); *H01L 23/525* (2013.01);
(Continued)

(58) Field of Classification Search
CPC ..... H01L 25/0657; H01L 24/06; H01L 24/09; H01L 24/10; H01L 24/11; H01L 24/14
See application file for complete search history.

(56) References Cited

U.S. PATENT DOCUMENTS

2008/0156521 A1 7/2008 Karasawa et al.
2014/0167254 A1* 6/2014 Yu ........................... H01L 24/11
257/737
(Continued)

FOREIGN PATENT DOCUMENTS

FR          2 828 334 A1    2/2003

OTHER PUBLICATIONS

Search Report as issued in French Patent Application No. 1852110, dated Oct. 29, 2018.
(Continued)

*Primary Examiner* — Phat X Cao
(74) *Attorney, Agent, or Firm* — Pillsbury Winthrop Shaw Pittman LLP

(57) ABSTRACT

A 3D stack includes a first chip having first interconnection pads of rectangular section, the first interconnection pads having a first pitch in a first direction and a second pitch in a second direction perpendicular to the first direction; and a second chip having second interconnection pads, the second interconnection pads having a third pitch in the first direction and a fourth pitch in the second direction, at least one part of the second interconnection pads being in contact with the first interconnection pads to electrically couple the first and second chips. The first interconnection pads have a first dimension in the first direction equal to m times the third pitch and a second dimension in the second direction equal to n times the fourth pitch. The first interconnection pads are separated two by two in the first direction by a first distance equal to q times the third pitch.

9 Claims, 6 Drawing Sheets

(51) Int. Cl.
    *H01L 23/522* (2006.01)
    *H01L 23/00* (2006.01)
    *H01L 23/528* (2006.01)
    *H01L 23/525* (2006.01)

(52) U.S. Cl.
    CPC ........ *H01L 23/528* (2013.01); *H01L 23/5226* (2013.01); *H01L 24/03* (2013.01); *H01L 24/05* (2013.01); *H01L 24/06* (2013.01); *H01L 24/08* (2013.01); *H01L 24/09* (2013.01); *H01L 24/13* (2013.01); *H01L 24/16* (2013.01); *H01L 2224/02373* (2013.01); *H01L 2224/03616* (2013.01); *H01L 2224/05552* (2013.01); *H01L 2224/05553* (2013.01); *H01L 2224/05555* (2013.01); *H01L 2224/06131* (2013.01); *H01L 2224/081* (2013.01); *H01L 2224/08121* (2013.01); *H01L 2224/08123* (2013.01); *H01L 2224/08145* (2013.01); *H01L 2224/13024* (2013.01); *H01L 2224/16227* (2013.01); *H01L 2224/80894* (2013.01); *H01L 2224/80895* (2013.01); *H01L 2225/065* (2013.01); *H01L 2225/06513* (2013.01); *H01L 2225/06517* (2013.01); *H01L 2225/06527* (2013.01); *H01L 2225/06568* (2013.01); *H01L 2924/15311* (2013.01); *H01L 2924/381* (2013.01)

(56) References Cited

U.S. PATENT DOCUMENTS

| | | |
|---|---|---|
| 2014/0252606 A1 | 9/2014 | Morimoto et al. |
| 2015/0008575 A1 | 1/2015 | Liu et al. |
| 2017/0154873 A1 | 6/2017 | Kim et al. |

OTHER PUBLICATIONS

Jani, I., et al., "Innovative Structures to Test Bonding Alignment and Characterize High Density Interconnects in 3D-IC," 2017 15th IEEE International New Circuits and Systems Conference (NEWCAS), Jun. 2017, XP033141924, pp. 153-156.

Kim, S.-W., et al., "Ultra-fine Pitch 3D Integration Using Face-to-Face Hybrid Wafer Bonding Combined with a Via-Middle Through-Silicon-Via Process," 2016 IEEE 66th Electronic Components and Technology Conference, (2016), pp. 1179-1185.

\* cited by examiner

3D STACK OF ELECTRONIC CHIPS

CROSS REFERENCE TO RELATED APPLICATIONS

This application claims priority to French Patent Application No. 1852110, filed Mar. 12, 2018, the entire content of which is incorporated herein by reference in its entirety.

FIELD

The present invention relates to three-dimensional integrated circuits (3D IC) and more specifically relates to a 3D stack of electronic chips that tolerates considerable misalignment between two superimposed electronic chips.

BACKGROUND

Three-dimensional (3D) integration consists in stacking several electronic chips (also called integrated circuits) and in electrically connecting them together, for example by a bonding technique. This approach notably makes it possible to reduce the size of so-called "heterogeneous" systems which are composed of circuits belonging to different technologies, for example an image sensor comprising a matrix of photodiodes and an image processing CMOS circuit comprising transistors. 3D integration also makes it possible to increase the density of transistors per surface unit without reducing their dimensions and to reduce the electrical consumption of a system, by replacing long horizontal interconnections by short vertical interconnections.

A 3D circuit can adopt several architectures notably as a function of the manner in which the chips are stacked, the orientation of the chips and the type of bonding.

The stack may be produced according to different approaches: wafer-to-wafer, die-to-wafer or die-to-die. The wafer-to-wafer stacking technique is the fastest in the number of chips bonded per hour, because it is a collective bonding at the silicon wafer scale. It is also the most precise for a given bonding speed. Conversely, unlike the two other techniques, it does not offer the possibility of only assembling functional chips (known as "Know Good Dies"), selected after a series of tests and cutting of the wafers. The yield after assembly obtained by the wafer-to-wafer technique is thus less than the yield of the die-to-wafer technique and the efficiency of the die-to-die technique. This latter technique is naturally the longest to implement, because the chips are bonded together two by two after cutting the wafers.

When the chips (or the wafers) are oriented in the same direction, the front face of a chip is bonded to the back face of another chip. This assembly mode is called "back-to-face". Conversely, when the chips (or the wafers) are assembled after turning one of them over, the chips are bonded front face against front face (face-to-face) or back face against back face (back-to-back).

FIG. 1 illustrates an example of 3D circuit integrating a first chip 100a and a second 100b in a package (here BGA) composed of a substrate 110 and a lid 120. The first chip 100a, called upper chip, is stacked on the second chip 100b, called lower chip. Each chip comprises, from the back face BS to the front face FS, a silicon substrate 101, a first functional block 102 (or set of technological levels) called FEOL (Front End Of Line) which groups together the active components (e.g. transistors) of the chip, and a second functional block 103 called BEOL (Back End Of Line) which groups together the passive components (e.g. resistances, inductances, capacitances) and the interconnections of the chip. The interconnections of the BEOL block 103 are typically distributed in several metal levels.

The chips 100a-100b are in this example assembled front face against front face (face-to-face) by a hybrid type direct bonding technique. Each chip has on the front face FS a bonding surface composed of interconnection pads 104 made of metal and insulating portions 105, typically made of silicon oxide. The insulating portions 105 separate the interconnection pads 104. The interconnection pads 104 of the first chip 100a are in direct contact with the interconnection pads 104 of the second chip 100b, so as to electrically couple the two chips 100a-100b. The interconnection pads, typically made of copper, contribute to the bonding of the two chips and transport the electrical signals from one chip to the next. The interconnection pads 104 on the front face FS of each chip are generally organised in lines and in columns, in the form of a matrix or mesh. The set of interconnection pads 104 belonging to the two chips 100a-100b constitutes a so-called 3D interconnection structure.

Through vias 106 designated by the acronym TSV (Through Silicon Vias) further extend through the lower chip 100b, and more specifically from the first metal level of the BEOL block up to the back face BS. These through vias 106 serve to transport the electrical signals from the front face FS of the chip 100b to its back face BS. The substrate 101 of the lower chip 100b is specially thinned to enable the production of these vias.

The signals are next distributed (or redistributed) on the back face BS of the lower chip 100b, using the redistribution layer 107 called RDL. The role of the RDL layer 107 is to electrically connect each of the TSVs 106 to a contact pick up zone, from which the signals are transported to the outside of the package protecting the chips.

A known assembly technique consists in adopting the same geometry for the matrix of interconnection pads 104 of the first chip 100a and the matrix of interconnection pads 104 of the second chip 100b. The interconnection pads 104 of the chips 100a-100b are then of same shape, for example of square section (in the plane of the front face FS), of same dimensions and spaced apart by the same distance. With such a 3D interconnection structure, the least misalignment during the bonding of the two chips results in a reduction in the contact surface between the interconnection pads 104. Yet a reduction in the contact surface is detrimental to the quality of bonding, notably from a mechanical viewpoint, and for the electrical performances of the stack. Since the misalignment tends to vary from one stack of chips to the next (even when the lower/upper chips belong to a same wafer, i.e. die-to-wafer or wafer-to-wafer approach), a dispersion related to the misalignment appears in the performances of the 3D circuits.

The document ["Ultra-fine Pitch 3D Integration Using Face-to-Face Hybrid Wafer Bonding Combined with a Via-Middle Through-Silicon-Via Process", SW. Kim et al., Electronic Components and Technology Conference (ECTC), IEEE 66th, 2016] proposes a solution to guarantee a constant contact surface between the 3D interconnection pads of two chips stacked one on the other. This solution, illustrated by FIG. 2, consists in adopting matrices of interconnection pads of different geometries. The upper chip 100a comprises a plurality of interconnection pads 104a of square section arranged in lines and in columns, with an identical pitch in the two directions, for example equal to 3.6 μm. The sides of the interconnection pads 104a then measure 0.9 μm, i.e. ¼ of the pitch. The lower chip 100b comprises interconnection pads 104b also arranged according to a square mesh of which the pitch is equal to 3.6 µm. The sides of the interconnection pads 104b measure however 2.7 µm, i.e. ¾ of the pitch.

In the case represented in FIG. 2, that of perfect alignment between the two chips, each interconnection pad 104a of the upper chip 100a is positioned at the centre of an interconnection pad 104b of the lower chip 100b. The contact surface between the pads 104a-104b is equal to the surface area of the smallest pad, 104a. As long as the pad 104a does not extend beyond the perimeter of the pad 104b, that is to say as long as the misalignment between the two chips does not exceed 0.9 µm in the direction of the lines and/or in the direction of the columns, this contact surface is moreover constant. As indicated in the document, a constant contact resistance limits the dispersion of the electrical performances within a same 3D circuit and between several 3D circuits, in particular in terms of electrical resistance.

The patent application US2017/154873 describes another stack of electronic chips that tolerates considerable misalignment and guarantees a constant contact surface within a certain tolerance interval. The 3D interconnection pads are in this stack located at the periphery of the chips.

FIG. 3 is a sectional view of the stack taken at the level of the bonding interface and limited to two 3D interconnection pads belonging to different chips. The interconnection pad 104a of the upper chip and the interconnection pad 104b of the lower chip have rectangular sections of same dimensions and are oriented perpendicularly with respect to each other. The length L over width W ratio of the pads 104a-104b is comprised between 2 and 4. The maximum tolerated misalignment, making it possible to obtain a constant contact surface, is in each direction equal to ±L/2, i.e. a tolerance interval of length L.

The 3D interconnection structures described above make the performances of the 3D circuits more homogeneous and improve their reliability, but makes their manufacture more complicated, in particular the step of planarization of the bonding surfaces by chemical mechanical planarization (CMP). Indeed, the metal (copper) that constitutes the interconnection pads is not distributed in a uniform manner over the surface of the chips. In the solution proposed by SW. Kim et al., the density of metal, which represents the surface of the pads over the total bonding surface, is only around 6% ($0.9^2/3.6^2$) for the lower chip. Wide portions of silicon oxide thus separate the interconnection pads 104b (cf. FIG. 2). The portions of oxide are also very important on the surface of the chips of the document US2017/154873, due to the perpendicular orientation of the pads and their position at the periphery of the chips. Since the silicon oxide is planarized more rapidly than the metal, it is difficult to obtain a flat bonding surface with such structures.

SUMMARY

It therefore exists a need to provide a stack of electronic chips that is tolerant to misalignment, reliable, easy to produce and of which the electrical performances are identical whatever the value of the misalignment within a tolerance interval.

According to an aspect of the invention, this need tends to be satisfied by providing a 3D stack of electronic chips comprising:
- a first chip having on a first face a plurality of first interconnection pads of rectangular section, arranged in lines and in columns, the columns of first interconnection pads having a first pitch in a first direction and the lines of first interconnection pads having a second pitch in a second direction perpendicular to the first direction;
- a second chip having, on a second face bonded to the first face of the first chip, a plurality of second interconnection pads arranged in lines and in columns, the columns of second interconnection pads having a third pitch in the first direction and the lines of second interconnection pads having a fourth pitch in the second direction, at least one part of the second interconnection pads being in contact with the first interconnection pads to electrically couple the first and second chips;

and wherein:
- the first interconnection pads have a first dimension in the first direction equal to m times the third pitch, where m is a non-zero natural integer, and a second dimension in the second direction equal to n times the fourth pitch, where n is a non-zero natural integer;
- the first interconnection pads belonging to a same line and to two consecutive columns are separated in the first direction by a first distance equal to q times the third pitch, where q is a non-zero natural integer;
- the first interconnection pads belonging to a same column and to two consecutive lines are separated in the second direction by a second distance equal to r times the fourth pitch, where r is a non-zero natural integer;
- the second interconnection pads are interconnected in a plurality of groups, each group comprising a number N of interconnected second interconnection pads such that:

$$N=(m+q)(n+r),$$

each group being electrically connected to a first interconnection pad by at least one of the second interconnection pads of the group.

For each of the first interconnection pads belonging to the first chip, a group of N (N being necessarily greater than or equal to 4) second interconnection pads regularly distributed over the surface of the second chip and electrically interconnected is provided. By multiplying in this way the number of second pads associated with each first pad, a better density of metal may be obtained at the surface of the second chip. The preparation of the second chip before its bonding, and notably the step of planarization of its bonding surface, is thereby facilitated.

The arrangement of the first pads and the second pads, in the form of matrices of which the dimensions are linked together (in each direction, the dimension and the spacing of the first pads are multiples of the pitch of the second pads), further guarantees a contact surface between the first pad and the associated group of second pads, as long as the misalignment between the chips is comprised within a misalignment range called tolerance interval or tolerance window. This constant contact surface makes it possible to obtain identical electrical performances whatever the value of the misalignment (within the tolerance interval) and a homogeneous bonding energy, within a same wafer or between several wafers/chips. The quality of the bonding—and thus the reliability of the stack—is consequently improved. Depending on the misalignment between the chips, the contact surface between the first pad and the group of second pads may extend to the entire surface by a second pad of the group or may be distributed over several (up to N) second pads of the group.

In an embodiment of the invention, the first dimension of the first interconnection pads is equal to the third pitch, the second dimension of the first interconnection pads is equal to the fourth pitch, the first distance is equal to the third pitch and the second distance is equal to the fourth pitch.

In an alternative embodiment, the first dimension of the first interconnection pads is equal to two times the third pitch, the second dimension of the first interconnection pads is equal to two times the fourth pitch, the first distance is equal to two times the third pitch and the second distance is equal to two times the fourth pitch.

The stack according to an embodiment of the invention may also have one or more of the characteristics below, considered individually or according to all technically possible combinations thereof.

In an embodiment, the first dimension of the first interconnection pads is further equal to the first pitch divided by 2 and the second dimension of the first interconnection pads is further equal to the second pitch divided by 2. The density of metal on the surface of the first chip is then equal to 25%. This configuration corresponds to a homogeneous distribution of metal in each of the first and second directions.

The first pitch is in an embodiment equal to the second pitch. The distribution of metal on the surface of the first chip is then the same in the first and second directions.

The second interconnection pads have for example a rectangular, round or octagonal section.

In an embodiment, the second interconnection pads have a first dimension in the first direction equal to the third pitch divided by 2 and a second dimension in the second direction equal to the fourth pitch divided by 2. The metal density on the surface of the second chip is then equal to 25%. This configuration corresponds to a homogeneous distribution of metal in each of the first and second directions.

The third pitch is in an embodiment equal to the fourth pitch. The distribution of metal on the surface of the second chip is then the same in the first and second directions.

According to a development, the second chip comprises a layer of active components and a plurality of metal interconnection levels connecting the active components, and at least one of the metal interconnection levels serves to interconnect the N second interconnection pads of each group.

BRIEF DESCRIPTION OF THE FIGURES

Other characteristics and benefits of the invention will become clearer from the description that is given thereof below, for indicative purposes and in no way limiting, while referring to the appended figures, among which.

For greater clarity, identical or similar elements are marked by identical reference signs in all of the figures.

DETAILED DESCRIPTION

In the following description, "3D interconnection structure" designates all of the interconnection pads that make it possible to electrically connect two electronic chips stacked (vertically) one on the other. These interconnection pads are present on one face of each electronic chip, which may be the front face or the back face. The front face of an electronic chip designates the face of a substrate, generally made of a semiconductor material such as silicon, on which are formed active components, for example transistors, then (if applicable) passive components and metal interconnection levels. The back face of the electronic chip is the face of the substrate opposite to the front face.

The two electronic chips are bonded together, in an embodiment by a direct bonding technique (i.e. without introducing an intermediate compound—such as an adhesive, a wax or a low melting point alloy—at the level of the bonding interface), for example of metal-metal type or of hybrid metal-dielectric type. The bonding may be carried out according to different approaches: front face against front face, back face against back face or front face against back face. The two faces that are bonded together are substantially flat, their topology generally not exceeding 15 nm. No space then exists between the chips after the bonding thereof, unlike other assembly technologies (typically by microbumps or micro-pillars), which have an important topology (of the order of several µm) and require the introduction of a polymer between the chips.

Figure 4:
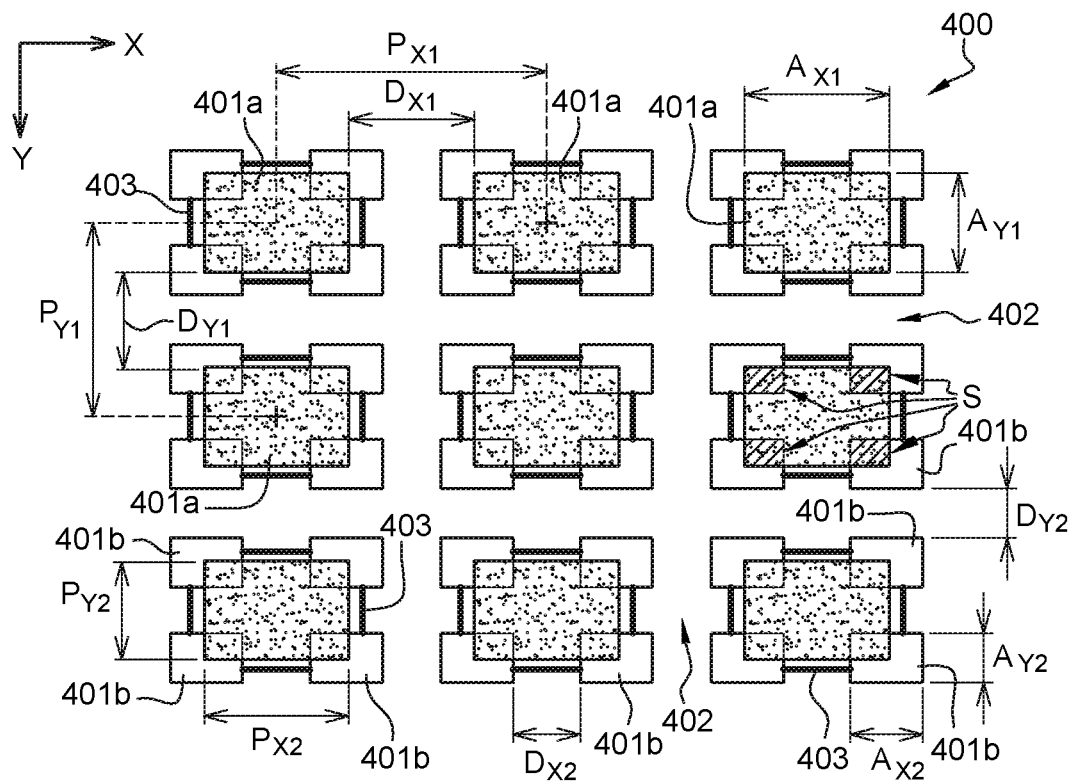
FIG. 4 represents a 3D interconnection structure employed in a stack of electronic chips according to a first embodiment of the invention.

FIG. 4 is a partial sectional view of a stack of electronic chips according to a first embodiment of the invention. This view is taken at the level of a bonding interface between two electronic chips and schematically represents a first 3D interconnection structure 400 ensuring the electrical connection between the two electronic chips.

The 3D interconnection structure 400 comprises a plurality of first identical interconnection pads 401a belonging to a first electronic chip and a plurality of second identical interconnection pads 401b belonging to a second electronic chip. The face of the first chip, on which the first interconnection pads 401a emerge, is bonded to the face of the second chip revealing the second interconnection pads 401b. The first interconnection pads 401a and the second interconnection pads 401b are in an embodiment made of metal, for example copper or aluminium, and contribute to the bonding of the first and second chips.

The second interconnection pads 401b of the second chip, as well as the first interconnection pads 401a of the first chip, are spaced apart from each other by electrically insulating portions 402, for example made of silicon oxide. The bonding surface of each chip is thus composed of metal interconnection pads surrounded by a dielectric material.

The first interconnection pads 401a of the first chip are distinct and arranged in lines and in columns, in the form of a matrix or mesh. The columns of first pads 401a have a first pitch $P_{X1}$ in a first direction X of the sectional plane of FIG. 4. This first pitch $P_{X1}$ is equal to the distance that separates the centres of two pads 401a belonging to a same line and to two consecutive columns. In the same way, the lines of first pads 401a have a second pitch $P_{Y1}$ in a second direction Y of the plane, perpendicular to the first direction X. This second pitch $P_{Y1}$ is equal to the distance that separates the centres of two pads 401a belonging to a same column and to two consecutive lines. In other words, the first interconnection pads 401a are reproduced in a periodic manner on the surface of the first chip, and this is so in the two directions X and Y.

The second interconnection pads 401b of the second chip are also distinct and arranged in lines and in columns. The columns of second pads 401b are repeated in the first direction X according to a third pitch $P_{X2}$, whereas the lines of second pads 401b are repeated in the second direction Y according to a fourth pitch $P_{Y2}$. The third and fourth pitches $P_{X2}$-$P_{Y2}$ are defined in the same way as the first and second pitches $P_{X1}$-$P_{Y1}$, with respect to the centres of the second pads 401b.

The number of lines and columns, and thus interconnection pads on the surface of each chip, depends on the desired interconnection density and the surface area of the bonding surface of the chips. In order not to clutter FIG. 4 unduly, only three columns and three lines of first pads 401a are represented and only six columns and six lines of second pads 401b are represented.

As illustrated in FIG. 4, the first pitch $P_{X1}$ (pitch along X of the first pads 401a) may be different from the second pitch $P_{Y1}$ (pitch along Y of the first pads 401a) and the third pitch $P_{X2}$ (pitch along X of the second pads 401b) may be different from the fourth pitch $P_{Y2}$ (pitch along Y of the second pads 401b). The first pads 401a and the second pads 402b are then in the form of rectangular meshes.

The first interconnection pads 401a have a section, in the plane of the bonding face, of rectangular shape. The dimensions of the first pads 401a in the first direction X and in the second direction Y are noted respectively $A_{X1}$ and $A_{Y1}$.

The section of the second interconnection pads 401b (in the plane of the bonding face) may be of any shape, for example rectangular (cf. FIG. 4), round or octagonal. The dimensions of the second pads 401b in the first direction X and in the second direction Y are noted respectively $A_{X2}$ and $A_{Y2}$. The distance that separates in the direction X two consecutive second pads 401b belonging to a same line is noted $D_{X2}$ and the distance that separates in the direction Y two consecutive second pads 401b belonging to a same column is noted $D_{Y2}$.

In this first embodiment, the dimension $A_{X1}$ along X of the first pads 401a is equal to the third pitch $P_{X2}$ and the dimension $A_{Y1}$ along Y of the first pads 401a is equal to the fourth pitch $P_{Y2}$. Moreover, the distance $D_{X1}$ that separates in the direction X two first consecutive pads 401a of a same line, that is to say the width of the insulating portion 402 separating two consecutive columns of first pads 401a, is equal to the third pitch $P_{X2}$. Similarly, the distance $D_{Y1}$ that separates in the direction Y two consecutive first pads 401a of a same column, that is to say the width of the insulating portion 402 separating two consecutive lines of first pads 401a, is equal to the fourth pitch $P_{Y2}$.

Although separated physically, the second interconnection pads 401b are interconnected by group of N, in an embodiment by means of metal tracks 403 situated in a plane parallel to the bonding face of the second chip. Each group of second interconnection pads 401b is electrically connected to a single first interconnection pad 401a. To produce this electrical connection, at least one second pad 401b of each group is in direct contact with the first pad 401a associated with the group. The number N of second pads 401b in the groups varies as a function of the dimensions $A_{X1}$-$A_{Y1}$ of the first pads 401a and the spacings $D_{X1}$-$D_{Y1}$ between the first pads 401a. As an example, in the embodiment of FIG. 4, each first pad 401a is connected to four interconnected (N=4) second pads 401b.

In an embodiment, the second chip comprises several metal interconnection levels (belonging to a functional block or set of technological levels called Back End Of Line or BEOL) connecting active components (belonging to a functional block called Front End Of Line or FEOL), for example transistors. At least one of the metal interconnection levels is beneficially used to interconnect the N second interconnection pads of each group. In other words, the metal tracks 403 connecting the second pads 401b are added to this metal interconnection level. Beneficially, the metal tracks 403 are added to the two final metal interconnection levels (i.e. the furthest from the active components), of which the interconnection density is lower. These two latter levels are normally used to produce the power delivery network of the chip and the creation of additional metal tracks 403 does not impact the performances of this delivery network.

A particularity of the interconnection structure 400 is that the contact surface S between each first pad 401a and the N second pads 401b of the associated group is independent of the misalignment related to the bonding of the first and second chips, as long as this misalignment does not exceed (along X and along Y) the threshold values delimiting a tolerance interval (or window).

The configuration shown in FIG. 4 is that of a perfect alignment between the two chips (zero misalignment along X and along Y). Each first pad 401a is centred on the group of second pads 401b to which it is connected. The contact surface S is distributed in a uniform manner over the four second pads 401b of the group. It is equal to the surface area of a second pad 401b.

Figure 5A:
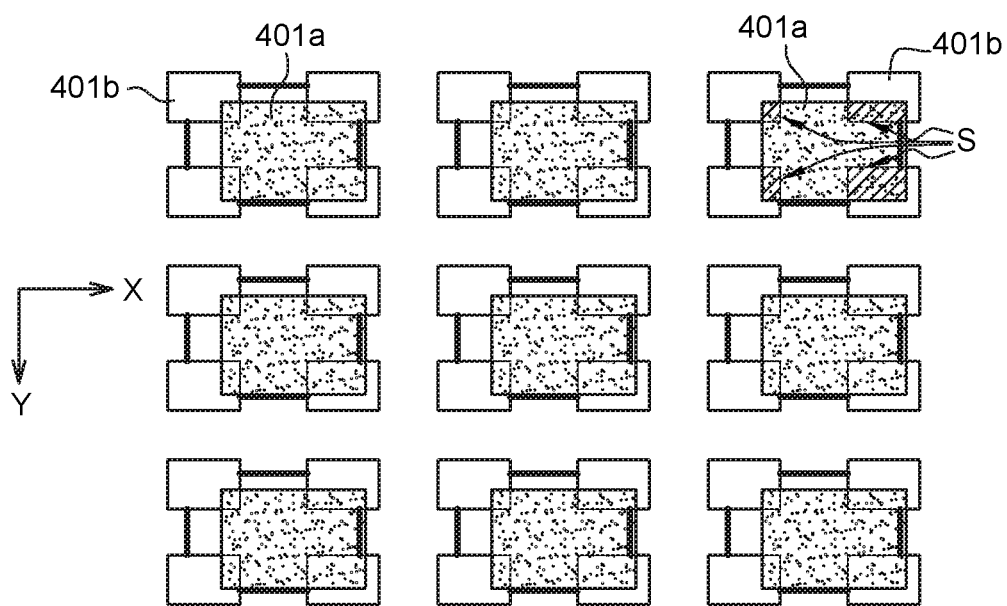
FIGS. 5A and 5B illustrate the 3D interconnection structure of FIG. 4 in misalignment situations of different values.
Figure 5B:
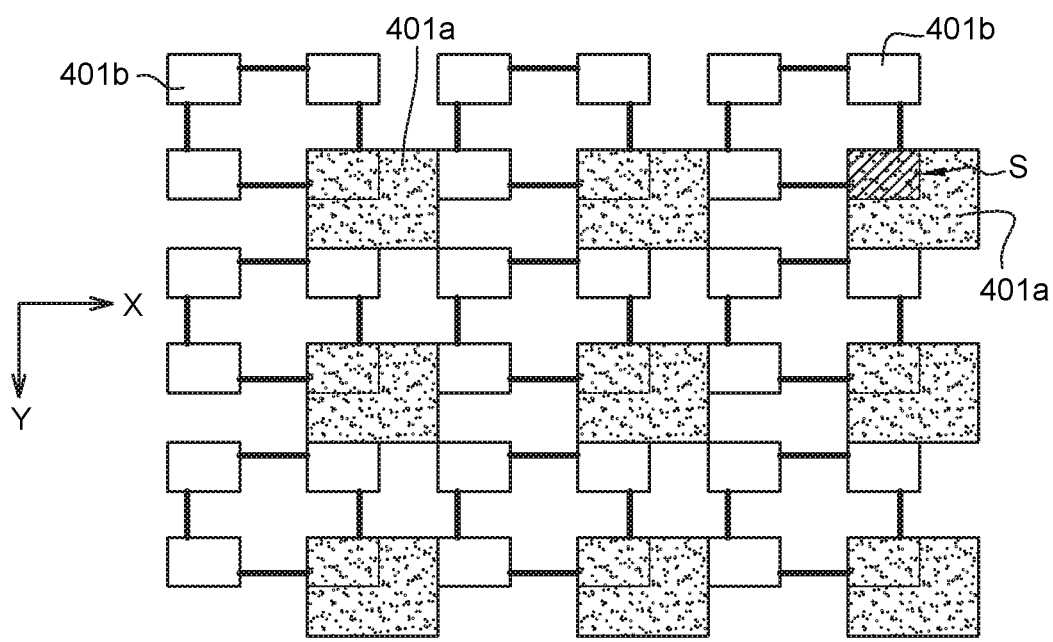

FIGS. 5A and 5B show two other configurations of the interconnection structure 400 (after bonding of the chips), in which the misalignment between the chips is not zero.

In the configuration of FIG. 5A, that of a moderate misalignment along X and along Y, the contact surface S is still distributed over the four pads of the group, but no longer in a uniform manner. However, the contact surface S is nevertheless identical to the configuration of FIG. 4, because the sum of the contact surfaces from first pad 401a to second pad 401b (so-called individual contact surfaces) is equal to the surface area of a second pad 401b. In the configuration of FIG. 5B, that of an extreme misalignment along X and along Y (at the limit of the tolerance intervals), the contact between the first pad 401a and the group of second pads 401b is no longer limited only to a single second pad 401b, over its whole surface area. The contact surface S is thus always the same.

This constant contact surface, whatever the value of the misalignment (within the tolerance interval) between the two chips, makes it possible to homogenise the electrical performances from one 3D stack to the next, notably their electrical resistance. This is valid whatever the transfer technique employed: die-to-die, die-to-wafer or wafer-to-wafer (the misalignment between the chips may vary from one spot to the other of the wafers, notably between the centre and the edge of the wafers).

A constant contact surface also implies an identical bonding energy between the different stacks, which is particularly beneficial in the case of die-to-wafer and wafer-to-wafer transfer techniques because it is next necessary to cut the stacks. The reliability of the 3D circuits from a mechanical viewpoint is thus improved overall.

Figure 1:
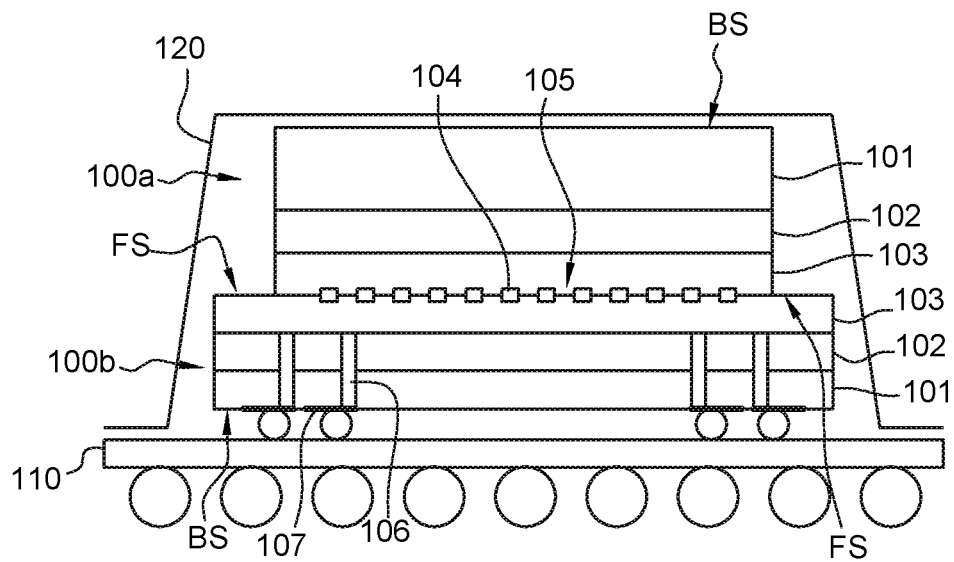
FIG. 1 shows a 3D circuit integrating a first example of stack of electronic chips according to the prior art.
Figure 2:
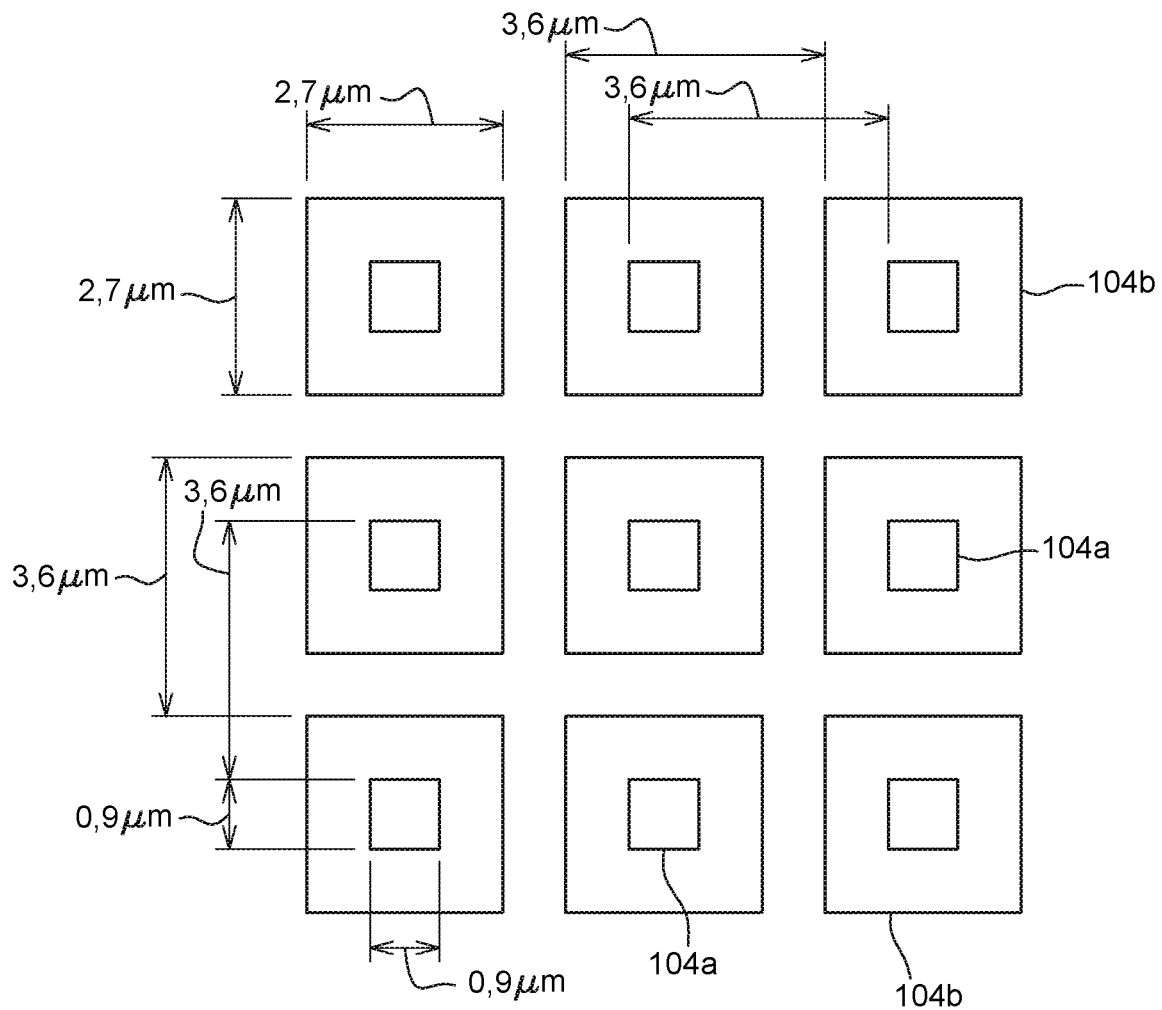
FIG. 2 represents a 3D interconnection structure employed in a second example of stack of electronic chips according to the prior art.
Figure 3:
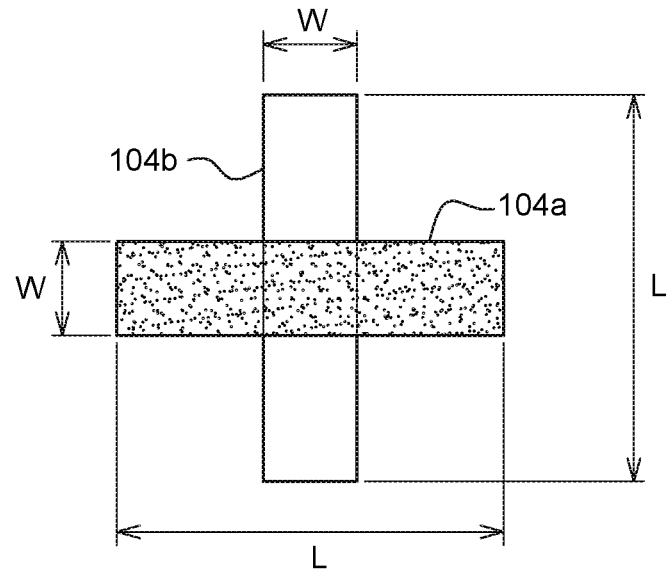
FIG. 3 represents a 3D interconnection structure employed in a third example of stack of electronic chips according to the prior art.

Finally, it is observed that the distribution of metal on the surface of the second chip (second interconnection pads 401b) is much better in the interconnection structure 400 than that obtained (for the upper chip) in the interconnection structure of the prior art (cf. FIG. 2, interconnection pads 104a). This is due to the fact that each first pad 401a is associated in the interconnection structure 400 with a multitude (at least 4) of second pads 401b, instead of a single one in the prior art. Thanks to this better distribution of metal, the manufacture of the second chip (before bonding) is facilitated, in particular the step of planarization of its bonding face by chemical mechanical planarization.

Figure 6:
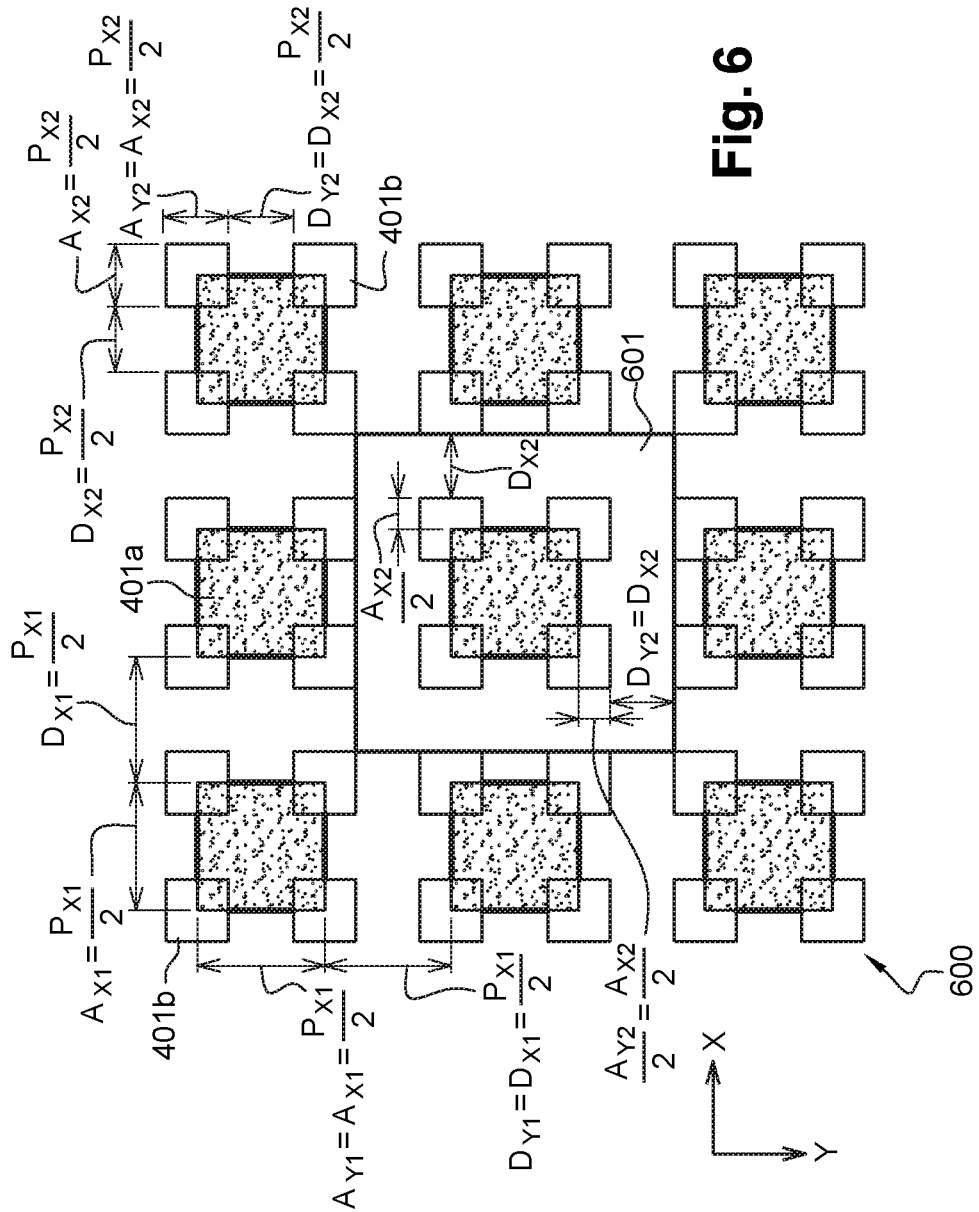
FIG. 6 represents a 3D interconnection structure employed in a stack of electronic chips according to a second embodiment of the invention.

FIG. 6 schematically represents a second 3D interconnection structure 600 belonging to a stack of chips according to a second embodiment of the invention.

The second interconnection structure 600 represents a particular case of the first interconnection structure 400, because the first and second interconnection pads 401a-401b have a section of square shape. Consequently, the dimension $A_{X1}$ along X of the first pads 401a is equal to the dimension $A_{Y1}$ along Y of the first pads 401a and the dimension $A_{X2}$ along X of the second pads 401b is equal to the dimension $A_{Y2}$ along Y of the second pads 401b.

As in the structure 400 of FIG. 4, the dimension $A_{X1}$ along X of the first pads 401a is beneficially equal to the first pitch $P_{X1}$ divided by two and the dimension $A_{Y1}$ along Y of the first pads 401a is beneficially equal to the second pitch $P_{Y1}$ divided by two. The density of metal $d_1$ of the first chip, which represents the surface of the first pads 401a over the total bonding surface, is then equal to 25%:

$$d_1 = \frac{A_{X1} \times A_{Y1}}{P_{X1} \times P_{Y1}} = \frac{P_{X1}/2 \times P_{Y1}/2}{P_{X1} \times P_{Y1}} = 0.25$$

A metal density $d_1$ of 25% represents an optimal solution for facilitating the preparation of the first chip, and more specifically the step of chemical mechanical planarization of its bonding face, because the portions of metal (pads 401a) along X and along Y are of same width as the dielectric portions (402).

It results from these geometric considerations that the first pitch $P_{X1}$ is equal to the second pitch $P_{Y1}$ (the mesh of first pads 401a is thus itself square). The distribution of metal is then the same in the direction of the lines (X) and in the direction of the columns (Y).

In the same beneficial manner, the dimension $A_{X2}$ along X of the second pads 401b and the dimension $A_{Y2}$ along Y of the second pads 401b are equal respectively to the third pitch $P_{X2}$ divided by two and to the fourth pitch $P_{Y2}$ divided by two. The density of metal $d_2$ on the surface of the second chip is then itself also equal to 25%:

$$d_2 = \frac{A_{X2} \times A_{Y2}}{P_{X2} \times P_{Y2}} = \frac{P_{X2}/2 \times P_{Y2}/2}{P_{X2} \times P_{Y2}} = 0.25$$

The benefits in terms of manufacturing described for the first chip are thus also valid for the second chip. As a comparison, the density of metal of one of the two chips (the upper chip) in the interconnection structure of the prior art (cf. FIG. 2) is only around 6%.

In view of these geometric choices, the third pitch $P_{X2}$ is equal to the fourth pitch $P_{Y2}$ (the mesh of second interconnection pads 401b is thus itself also square).

The maximum allowed misalignment along X, hereafter noted $F_X$, in the interconnection structure 600 is equal to half the dimension $A_{X2}$ of the second pads 401b plus the distance $D_{X2}$ between two consecutive second pads 401b. Indeed, a first pad 401a should not enter into contact with the second pads 401b of the adjacent groups. The maximum allowed misalignment along X is thus here equal to ¾ of the third pitch $P_{X2}$ (because $A_{X2}=D_{X2}=P_{X2}/2$) or instead ⅜ of the first pitch $P_{X1}$ (because $P_{X1}=A_{X1}+D_{X1}=2*P_{X2}$):

$$F_X = \pm\left(\frac{A_{X2}}{2} + D_{X2}\right) = \pm\frac{3}{4}P_{X2} = \pm\frac{3}{8}P_{X1}$$

The tolerance window, represented by the zone 601 in FIG. 6, thus has a length along X equal to 75% of the first pitch $P_{X1}$.

The maximum allowed misalignment along Y (noted $F_Y$) is identical to that allowed along X (because the distances, dimensions and pitch along Y are the same as along X), i.e. a tolerance window of width along Y equal to 75% of the first pitch $P_{X1}$.

As a comparison, in the interconnection structure of the prior art (FIG. 2), the tolerance window is only 50% of the pitch (2*0.9 µm/3.6 µm=0.5), along X and along Y.

For a same (first) pitch (that is to say a same "functional" 3D interconnection density) the interconnection structure 600 according to the invention thus tolerates a greater misalignment than the interconnection structure of the prior art.

Figure 7:
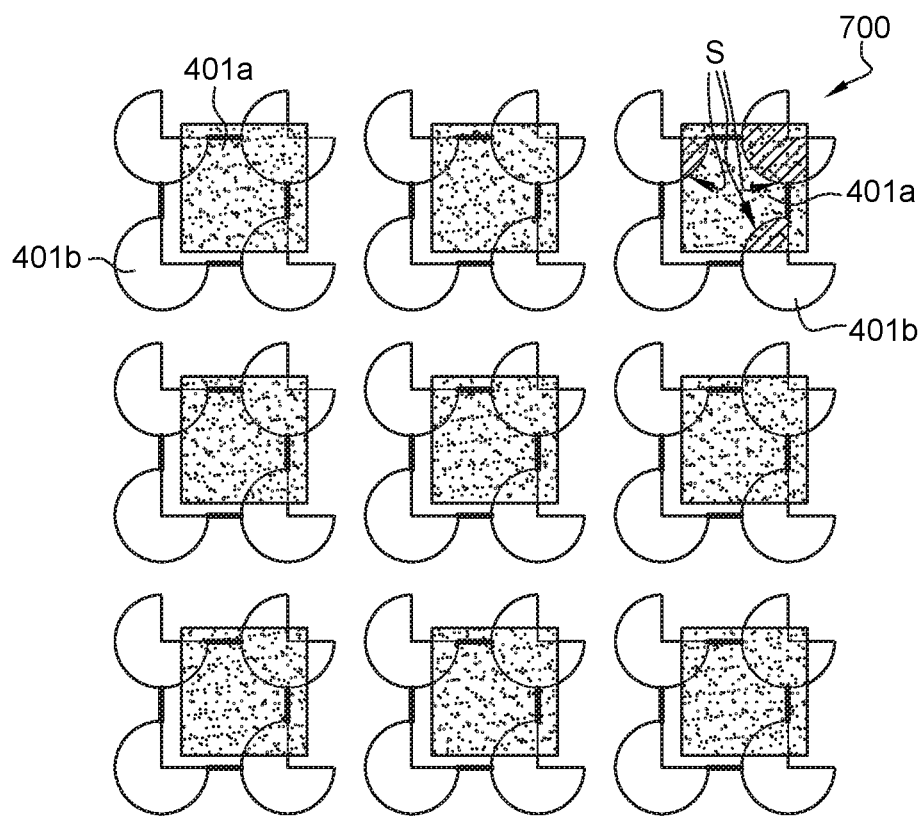
FIG. 7 represents a 3D interconnection structure employed in a stack of electronic chips according to a third embodiment of the invention.

FIG. 7 schematically represents a third 3D interconnection structure 700 belonging to a stack of chips according to a third embodiment of the invention.

The third interconnection structure 700 differs from the second interconnection structure 600 uniquely in the shape of the second interconnection pads 401b. The section of the second pads 401b is not in fact limited to a rectangular (FIG. 4) or square (FIG. 6) shape. A constant contact surface S (whatever the misalignment within the tolerance interval) is in fact obtained even if the section of the second pads 401b is not symmetrical along X and along Y. In the embodiment of FIG. 7, the contact surface S is still equal to the surface area of a second pad 401b.

Figure 8:
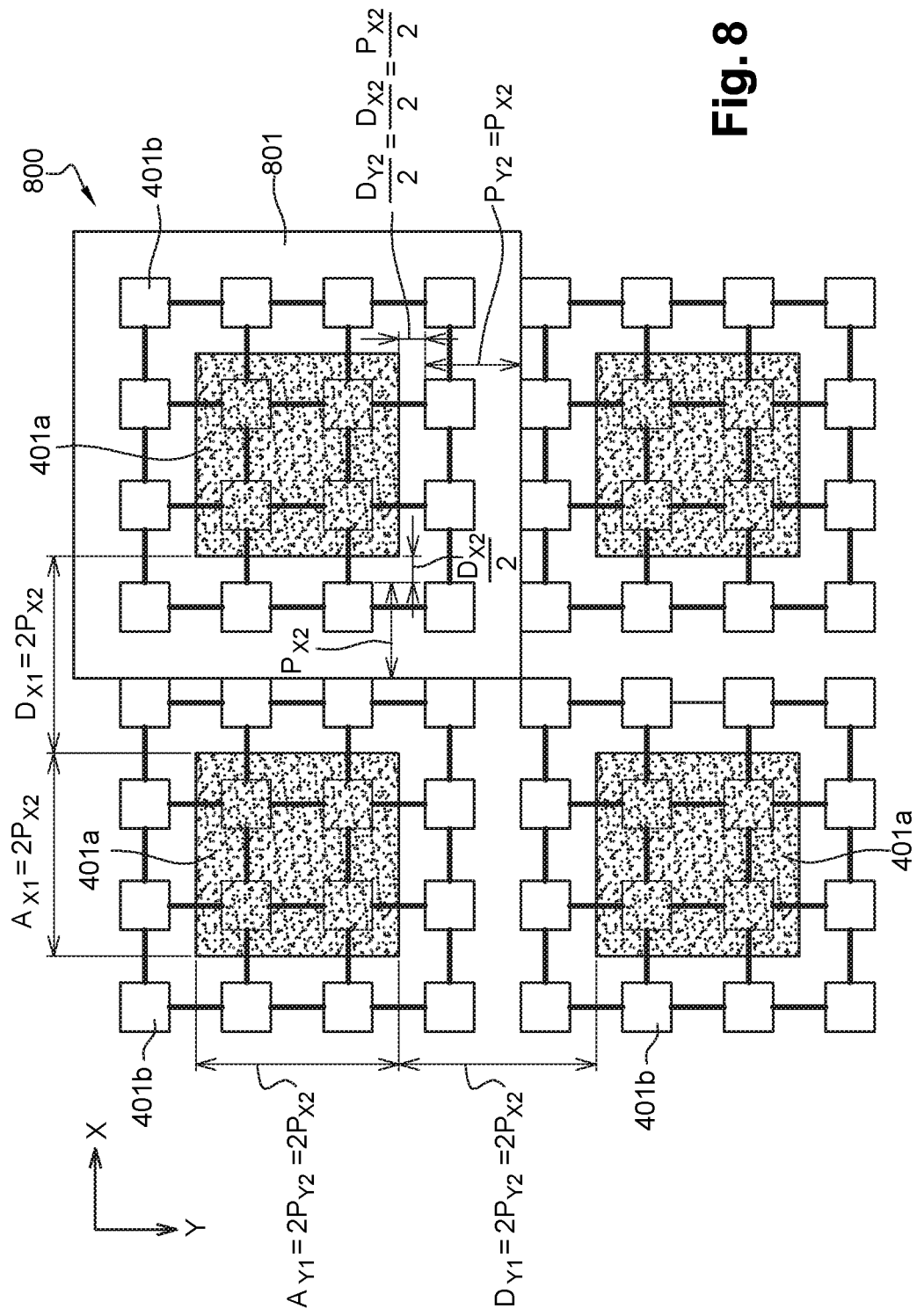
FIG. 8 represents a 3D interconnection structure employed in a stack of electronic chips according to a fourth embodiment of the invention.

In a fourth interconnection structure 800 represented by FIG. 8, the first and second pads 401a-401b are of square section and organised according to meshes that are also square. The first pitch $P_{X1}$ is thus equal to the second pitch $P_{Y1}$ and the third pitch $P_{X2}$ is equal to the fourth pitch $P_{Y2}$. The dimensions $A_{X1}$ (along X) and $A_{Y1}$ (along Y) of the first pads 401a, as well as the distances $D_{X1}$ (along X) and $D_{Y1}$ (along Y) that separates the first pads 401a, are further equal to two times the third (or fourth) pitches $P_{X2}$ (=$P_{Y2}$). The dimensions $A_{X2}$ (along X) and $A_{Y2}$ (along Y) of the second pads 401b are equal to the third pitch $P_{X2}$ divided by 2. The metal densities $d_1$ and $d_2$ are still consequently equal to 25%. The number N of interconnected second pads in each group is equal to 16 (they are distributed according to a 4×4 matrix). The contact surface S is constant and equal to the surface area of four second pads 401b, whatever the value of the misalignment within the tolerance interval.

The maximum allowed misalignments along X ($F_X$) and along Y ($F_Y$) are equal to one times the third pitch $P_{X2}$ plus half the distance $D_{X2}$ between two consecutive second pads 401b, i.e. here 5/4 of the third pitch $P_{X2}$ or instead 5/16 of the first pitch $P_{X1}$ (because $P_{X1}=A_{X1}+D_{X1}=4*P_{X2}$):

$$F_X = F_Y = \pm\left(\frac{D_{X2}}{2} + P_{X2}\right) = \pm\frac{5}{4}P_{X2} = = \pm\frac{5}{16}P_{X1}$$

The tolerance window, represented by the zone 801 in FIG. 8, thus has a length along X and a width along Y equal to 62.5% of the first pitch $P_{X1}$. The tolerance window of the fourth interconnection structure 800 is thus less extended than that of the second interconnection structure 600 ($F_X=F_Y=75\%$) but still more extended than the tolerance window of the interconnection structure according to the prior art.

More generally, a constant contact surface S may be obtained with an interconnection structure of the type of FIG. 4 from the moment that it meets the following criteria:
- the dimension $A_{X1}$ along X of the first pads 401a is equal to m times the third pitch $P_{X2}$, where m is a first non-zero natural integer;
- the dimension $A_{Y1}$ along Y of the first pads 401a is equal to n times the fourth pitch $P_{Y2}$, where n is a second non-zero natural integer;
- the distance $D_{X1}$ that separates in the direction X two consecutive first pads 401a (of a same line) is equal to q times the third pitch $P_{X2}$, where q is a third non-zero natural integer;
- the distance $D_{Y1}$ that separates in the direction Y two consecutive first pads 401a is equal to r times the fourth pitch $P_{Y2}$, where r is a fourth non-zero natural integer.

The natural integers m, n, q and r may be equal or different to each other.

The number N of interconnected second interconnection pads 401b in each group satisfies the following equation:

$$N=(m+q)(n+r)$$

The contact surface S between each first pad 401a and the N second pads 401b of the associated group is given by the following formula:

$$S = 4 \times \left(\frac{S_{pad}}{4}\right) + 2 \times (m-1)\left(\frac{S_{pad}}{2}\right) + 2 \times (n-1)\left(\frac{S_{pad}}{2}\right) + (m-1)(n-1) \times S_{pad} = m \times n \times S_{pad}$$

with $S_{pad}$ the surface area of a second interconnection pad 401b.

In the first embodiment (FIG. 4), the second embodiment (FIG. 6) and the third embodiment (FIG. 7), the natural integers m, n, q and r are all equal to 1 ($A_{X1}=P_{X2}$, $A_{Y1}=P_{Y2}$, $D_{X1}=P_{X2}$ and $D_{Y1}=P_{Y2}$). As indicated previously, the number N of second pads 401b in each group is equal to 4 (N=4) and the contact surface S is equal to the surface area $S_{pad}$ of a second interconnection pad 401b ($S=S_{pad}$).

In the fourth embodiment (FIG. 8), the natural integers m, n, q and r are all equal to 2 ($A_{X1}=2*P_{X2}$, $A_{Y1}=2*P_{Y2}$, $D_{X1}=2*P_{X2}$ and $D_{Y1}=2*P_{Y2}$). The number N of second pads 401b in each group is equal to 16 (N=16), the contact surface area S is equal to the surface area of four second pads 401b ($S=4*S_{pad}$).

The interconnection structures 400, 600, 700 and 800 described below tolerate, apart from a misalignment related to the bonding of the chips (and represented by FIGS. 5A-5B), an offset of the interconnection pads within a single chip. In other words, the contact surface S between a first pad 401a and a group of second pads 401b remains constant even if the distance between the pads 401a or 401b varies slightly within the matrix. This offset is variable as a function of the position on the wafer (low between two neighbouring pads, but may be important between two pads far apart on the wafer). It is for example due to an expansion of the materials or to misalignments during the manufacturing steps of the chips (photolithography steps notably). The electrical performances of the 3D interconnections, and notably their electrical resistance, are thus homogeneous within a same stack. For the same reason, the bonding energy is homogeneous within a same stack, which improves the mechanical strength and the reliability of the stack.

These interconnection structures can be used whatever the value of the pitch of the first pads 401a, called "functional" pitch because it determines the density of the 3D interconnections in the stack. They prove however particularly beneficial for a functional pitch less than 2 µm. Indeed, with such a pitch, the 3D interconnection pads and the metal lines of the upper interconnection levels have very similar dimensions. The interest of having a constant contact surface S, and thus a homogeneous electrical resistance, is thus very high. Conversely, when the functional pitch is of the order of 4-5 µm or more, the 3D interconnection pads are larger and the resistance of the metal lines is great compared to that of the 3D interconnection pads. The variation in the contact surface S then influences to a lesser extent the overall electrical performances of the interconnections that connect the active components of the two chips (3D interconnections, metal lines of the interconnection levels and vias between the levels).

Many variants and modifications of the stack of electronic chips according to the invention will become clear to the man skilled in the art. The characteristics of the interconnection structures 400, 600, 700 and 800, described through FIGS. 4, 6 to 8, may be easily combined together. It is notably possible to combine the characteristics relative to the shape of the second pads 401b, to the pitch along X and along Y of the pads 401a-401b and to the dimensions of the pads 401a-401b with respect to the pitch, to define new 3D interconnection structures benefiting from the same benefits.

The stack of electronic chips according to the invention comprises at least the first and second electronic chips. The first chip provided with the first interconnection pads 401a may be arranged on the second chip provided with the second interconnection pads 401b, or vice versa. A stack of more than two electronic chips comprises more than one 3D interconnection structure and at least one of the electronic chips has the interconnection pads on its two faces (front face and back face).

The invention claimed is:

1. A 3D stack of electronic chips comprising:
a first chip having on a first face a plurality of first interconnection pads of rectangular section, arranged in lines and in columns, the columns of first interconnection pads having a first pitch in a first direction and the lines of first interconnection pads having a second pitch in a second direction perpendicular to the first direction;
a second chip having, on a second face bonded to the first face of the first chip, a plurality of second interconnection pads arranged in lines and in columns, the columns of second interconnection pads having a third pitch in the first direction and the lines of second interconnection pads having a fourth pitch in the second direction, at least one part of the second interconnection pads being in contact with the first interconnection pads to electrically couple the first and second chips;

wherein:
the first interconnection pads have a first dimension in the first direction equal to m times the third pitch, where m is a non-zero natural integer, and a second dimension in the second direction equal to n times the fourth pitch, where n is a non-zero natural integer;

the first interconnection pads belonging to a same line and to two consecutive columns are separated in the first direction by a first distance equal to q times the third pitch, where q is a non-zero natural integer;

the first interconnection pads belonging to a same column and to two consecutive lines are separated in the second direction by a second distance equal to r times the fourth pitch, where r is a non-zero natural integer;

the second interconnection pads are interconnected in a plurality of groups, each group comprising a number N of interconnected second interconnection pads such that:

$$N=(m+q)(n+r),$$

each group being electrically connected to a first interconnection pad by at least one of the second interconnection pads of the group.

2. The 3D stack according to claim 1, wherein the first dimension of the first interconnection pads is further equal to the first pitch divided by 2 and wherein the second dimension of the first interconnection pads is further equal to the second pitch divided by 2.

3. The 3D stack according to claim 2, wherein the first pitch is equal to the second pitch.

4. The 3D stack according to claim 1 wherein the second interconnection pads have a rectangular, round or octagonal section.

5. The 3D stack according to claim 1, wherein the second interconnection pads have a first dimension in the first direction equal to the third pitch divided by 2 and a second dimension in the second direction equal to the fourth pitch divided by 2.

6. The 3D stack according to claim 5, wherein the third pitch is equal to the fourth pitch.

7. The 3D stack according to claim 1, wherein:
the first dimension of the first interconnection pads is equal to the third pitch;
the second dimension of the first interconnection pads is equal to the fourth pitch;
the first distance is equal to the third pitch; and
the second distance is equal to the fourth pitch.

8. The 3D stack according to claim 1, wherein:
the first dimension of the first interconnection pads is equal to two times the third pitch;
the second dimension of the first interconnection pads is equal to two times the fourth pitch;
the first distance is equal to two times the third pitch; and
the second distance is equal to two times the fourth pitch.

9. The 3D stack according to claim 1, wherein the second chip comprises a layer of active components and a plurality of metal interconnection levels connecting the active components, and wherein at least one of the metal interconnection levels serves to interconnect the N second interconnection pads of each group.

* * * * *